(12) United States Patent
Ariyoshi

(10) Patent No.: US 6,678,298 B2
(45) Date of Patent: Jan. 13, 2004

(54) SEMICONDUCTOR LASER CHIP AND OPTICAL PICKUP USING THE SAME

(75) Inventor: Akira Ariyoshi, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 112 days.

(21) Appl. No.: 09/860,442

(22) Filed: May 21, 2001

(65) Prior Publication Data

US 2001/0043633 A1 Nov. 22, 2001

(30) Foreign Application Priority Data

May 19, 2000 (JP) ........................................ 2000-147200

(51) Int. Cl.⁷ ................................................. H01S 5/00
(52) U.S. Cl. ............................ 372/43; 372/44; 372/45; 372/46
(58) Field of Search ............................... 372/43, 44, 45, 372/46

(56) References Cited

U.S. PATENT DOCUMENTS

| 4,879,724 A | * | 11/1989 | Matsumoto et al. | .......... 372/46 |
|---|---|---|---|---|
| 4,913,525 A | * | 4/1990 | Asakura et al. | ............. 359/559 |
| 5,392,304 A | * | 2/1995 | Tanaka et al. | ................ 372/36 |
| 5,621,746 A | | 4/1997 | Futatsugi et al. | ............. 372/45 |
| 5,814,532 A | | 9/1998 | Ichihara | ....................... 438/33 |
| 6,370,176 B1 | * | 4/2002 | Okumura | ..................... 372/45 |
| 6,456,635 B1 | * | 9/2002 | Shiomoto et al. | ............. 372/36 |

FOREIGN PATENT DOCUMENTS

| JP | 6-132602 | 5/1994 |
| JP | 6-196813 | 7/1994 |
| JP | 6-204609 | 7/1994 |
| JP | 6-302004 | 10/1994 |
| JP | 9-091742 | 4/1997 |
| JP | 9-298339 | 11/1997 |
| JP | 11-017282 | 1/1999 |
| JP | 11-233892 | 8/1999 |
| WO | WO-04614 A1 * | 1/2000 | ............. H01S/3/18 |

* cited by examiner

Primary Examiner—Paul Ip
Assistant Examiner—James Menefee
(74) Attorney, Agent, or Firm—Nixon & Vanderhye P.C.

(57) ABSTRACT

A semiconductor laser chip has an emission point on a PN junction thereof. The emission point is located at a distance of 80 $\mu$m or less along the PN junction from a lateral side surface of the semiconductor laser chip.

7 Claims, 4 Drawing Sheets

SEMICONDUCTOR LASER CHIP AND OPTICAL PICKUP USING THE SAME

BACKGROUND OF THE INVENTION

The present invention generally relates to an optical pickup for use in an optical disk system, and more particularly, to a semiconductor laser device and a semiconductor laser chip used in the optical pickup.

FIG. 1 is a schematic view of an optical disk system that includes an optical pickup having a semiconductor laser device and using a three-beam tracking method. To simplify the drawing, a collimator lens, a beam splitter, and some other optical elements are not shown in FIG. 1. As a matter of convenience, a laser chip is shown enlarged without being drawn to scale.

Light emitted from a semiconductor laser chip 1, including a main beam 11 and sub-beams 12, is reflected from an information-recording surface including a track 7 of an information-recording medium 6 such as an optical disk (e.g., a compact disk or a magneto-optic disk). The reflected light of both the main beam 11 and the sub-beams 12, 12 passes through an objective lens 5 and then reflected by an inclined mirror 4 for diverting the light path. Then, the reflected light passes through a diffraction grating 3 and enters an end surface of the semiconductor laser chip 1 as returned light. The optical pickup is so constructed that the returned main beam returns to an emission point 9.

As shown in FIG. 2, in the optical pickup having the semiconductor laser chip 1, the optical axis of light emitted from the semiconductor laser chip 1 to the inclined mirror 4 is disposed approximately parallel (up to about 3°) to a tangential direction 8 of a track of the optical disk 6. In this case, the returned sub-beams 10 are incident on the end surface of the semiconductor laser chip 1 at points which are located at a distance of 70–80 $\mu$m from the emission point 9 in a direction almost perpendicular (about 87° to 90°) to a PN junction 2 in the semiconductor laser chip 1, as clearly shown in FIG. 3. In FIG. 3, reference numeral 15 represents a submount or stem on which the laser chip 1 is mounted, and reference numeral 16 represents an imaginary line connecting two returned sub-beams.

There are cases in which the returned sub-beams 10 are reflected from the end surface of the semiconductor laser chip 1, fed back to the optical system and adversely affect an S/N ratio.

In a conventional solution to the problem, the semiconductor laser chip is thinned or the PN junction is disposed at the center of the semiconductor laser chip. That is, by taking measures to prevent the returned sub-beams 10 from being incident on the end surface of the semiconductor laser chip, the returned sub-beams 10 are prevented from being fed back to the inside of the semiconductor laser chip.

Another conventional solution is to prevent the reflection of the returned sub-beams from the end surface of the semiconductor laser chip by reducing the reflectance of those portions of the end surface upon which the returned sub-beams are incident or applying a resin to such portions, instead of modifying the configuration of the semiconductor laser chip. These solutions, however, require a special processing of the semiconductor laser chip. Thus, these solutions cost more than the previously mentioned solutions of preventing the returned sub-beams from being incident on the end surface of the semiconductor laser chip.

The optical pickup 13 shown in FIG. 2 is arranged such that the optical axis of light emitted from the semiconductor laser chip 1 to the inclined mirror 4 is approximately parallel (up to about 3°) to the tangential direction 8 of the information-recording track of the optical disk 6, as described above. In this case, in reading and writing information from and to an outermost track 14 of the optical disk 6 loaded, the optical pickup 13 protrudes largely outward from the optical disk 6.

SUMMARY OF THE INVENTION

Thus, it is an object of the present invention to provide an optical pickup which hardly protrudes from an optical disk loaded to thereby make an entire optical disk system compact while cutting off a noise caused by returned sub-beams, and also to provide a semiconductor laser chip and a semiconductor laser device that realize such an optical pickup at low costs.

According to an aspect of the invention, there is provided a semiconductor laser chip having an emission point on a PN junction thereof, wherein said emission point is located at a distance of 80 $\mu$m or less along the PN junction from a lateral side surface of the semiconductor laser chip.

The semiconductor laser chip may have a light emission end surface of a shape of a parallelogram. The parallelogram may have right angles or oblique angles at its vertexes.

The semiconductor laser chip may have a width of 160 $\mu$m or less, wherein the laser chip width is defined between opposite lateral side surfaces of the semiconductor laser chip. In this case, the emission point is located within 80 $\mu$m of both lateral side surfaces.

An optical pickup according to another aspect of the present invention has the semiconductor laser chip as described above. The optical pickup reads information from an information-recording medium by irradiating the information-recording medium with light emitted from the semiconductor laser chip. When light is emitted from the semiconductor laser chip, there take place a plurality of returned beams from the information-recording medium to a plane including an end surface of the semiconductor laser chip, and an imaginary line connecting points of incidence of the returned beams on the plane forms an angle of less than 90° with the PN junction of the semiconductor laser chip.

The plurality of returned beams may comprise a returned main beam and one or more returned sub-beams. The one or more returned sub-beams are not incident on the end surface of the semiconductor laser chip.

The present invention also provides a semiconductor laser device for use as a light source of an optical pickup detecting a track signal by a method using sub-beams. The semiconductor laser device includes a semiconductor laser chip having an emission point that is located at a distance of 80 $\mu$m or less from a lateral side surface of the semiconductor laser chip.

An optical pickup according to a further aspect of the present invention has a mirror which diverts a light path toward an information-recording surface of an optical disk placed in position, and a grating which generates one or more sub-beams. The grating is disposed in such a way that an angle θ of 5°–90° is formed between the information-recording surface and a direction in which the grating is oriented.

The present invention prevents returned sub-beams from being incident on the end surface of the semiconductor laser chip by locating the emission point of the semiconductor laser chip within 80 $\mu$m of one lateral side surface thereof even though an optical axis of light travelling from the semiconductor laser chip to the diverting mirror is inclined with respect to the tangential direction of a track of the optical disk. Thus, the present invention avoids the problem that the returned sub-beams are reflected from the end surface of the semiconductor laser chip and fed back to the optical system to adversely affect the S/N ratio. At the same time, the present invention realizes size reduction of an entire optical disk system.

The position in a horizontal direction with respect to the PN junction of the emission point of the semiconductor laser chip can be easily achieved by adjusting a marking-off position during a chip-dividing step of the semiconductor laser chip production process, while the position in a vertical direction with respect to the PN junction of the emission point can be easily achieved by adjusting an amount of crystal growth during the semiconductor laser chip production process. Thus it is unnecessary to carry out an additional process step such as processing of the end surface of the semiconductor laser chip or application of resin to the end surface of the semiconductor laser chip.

Owing to the construction described above, even without additional processing to the laser chip, the present invention prevents deterioration in performance of the semiconductor laser device due to reflection of returned sub-beams from the end surface of the semiconductor laser chip, which has been the problem in manufacturing a compact end product. The present invention achieves the simplification of the manufacturing process and the improvement of product quality.

BRIEF DESCRIPTION OF THE DRAWINGS

The present invention will become more fully understood from the detailed description given hereinbelow and the accompanying drawings which are given by way of illustration only, and thus are not limitative of the present invention, and therein.

DETAILED DESCRIPTION OF THE PREFERRED EMBODIMENTS

Figure 4:
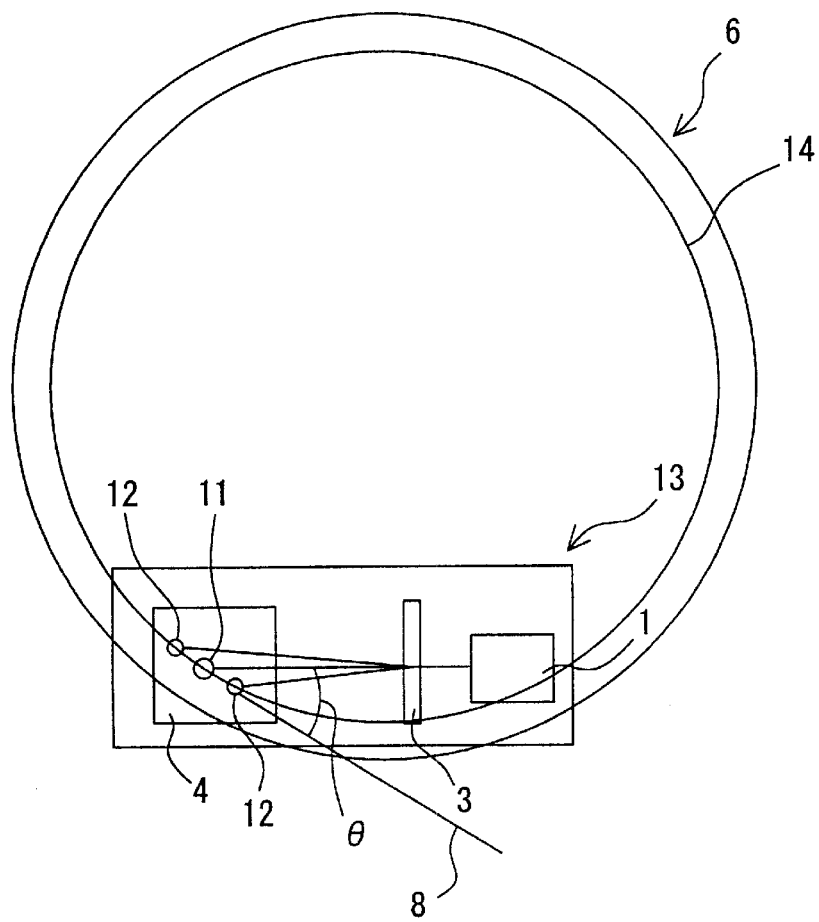
FIG. 4 is a schematic view showing an optical disk system to which the present invention is applied.

FIG. 4 is a schematic view showing an optical disk system having an optical pickup according to an embodiment of the present invention. In FIG. 4, parts same as or similar to the parts shown in FIG. 2 are designated by the same reference numerals used in FIG. 2.

In the embodiment, to prevent the optical pickup 13 from projecting outward from a loaded optical disk 6 in reading and writing information from and to an outermost information-recording track 14 of the optical disk 6, the optical pickup is arranged such that the optical axis of light emitted from a semiconductor laser chip 1 to an inclined mirror 4 extends at an angle $\theta$ of about 5°–90° relative to the tangential direction 8 of the track of the optical disk 6. That is, a diffraction grating 3 is inclined about 5°–90° with respect to an information-recording surface of the optical disk 6. In the example shown in FIG. 4, the angle of inclination $\theta$ is about 30°.

Figure 1:
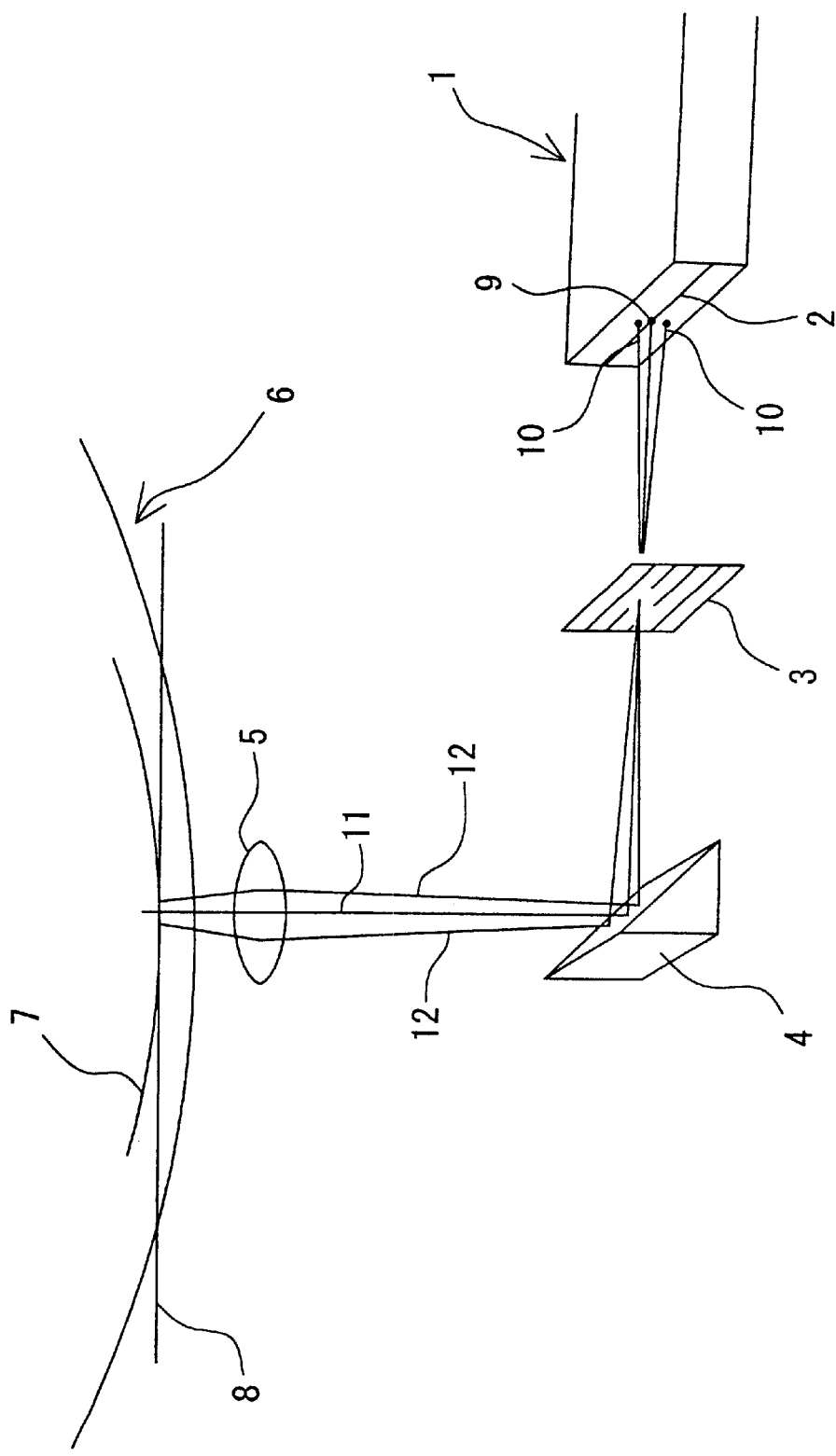
FIG. 1 is a schematic view showing the construction of a conventional optical disk system.
Figure 2:
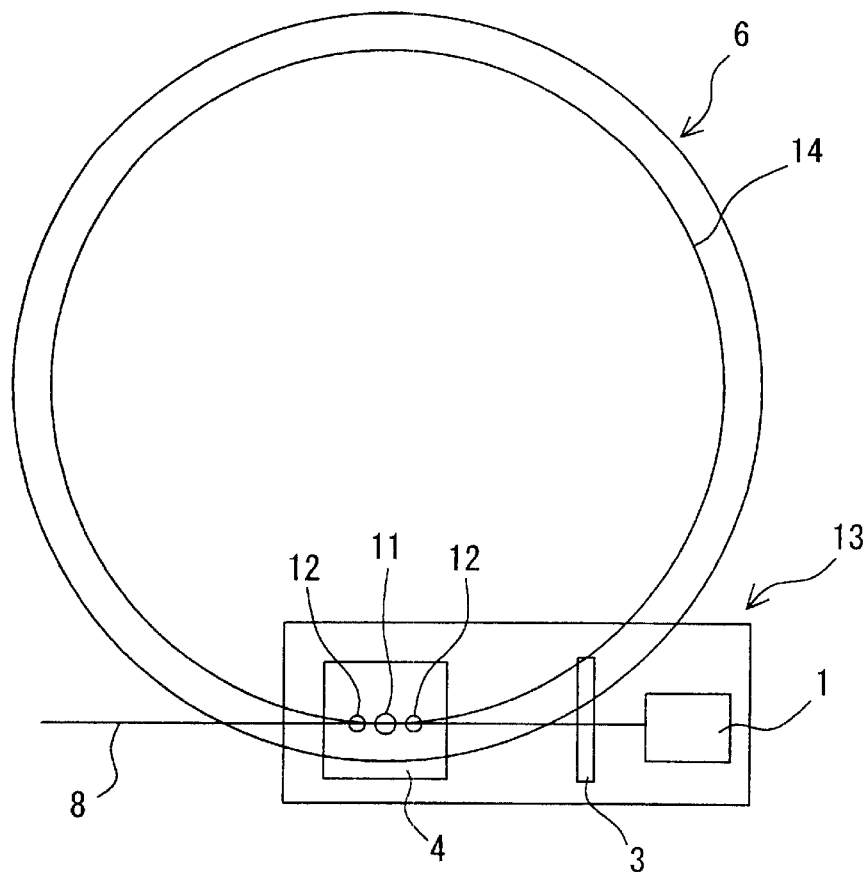
FIG. 2 is a schematic view showing the construction of a conventional optical disk system.
Figure 3:
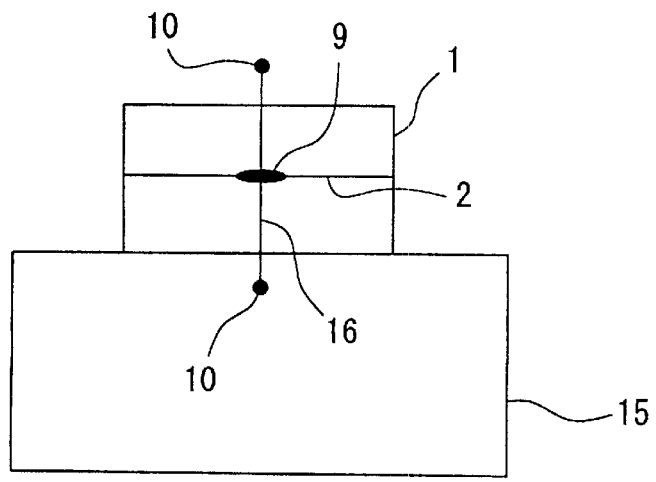
FIG. 3 is a schematic view showing an end surface of a conventional semiconductor laser device.

In the optical disk system thus constructed, unlike the conventional art shown in FIG. 2, in reading and writing the information of the outermost track 14 of the optical disk 6, the optical pickup 13 hardly protrudes outward from the optical disk 6. Thus, it is possible to make the optical disk system compact.

Figure 5:
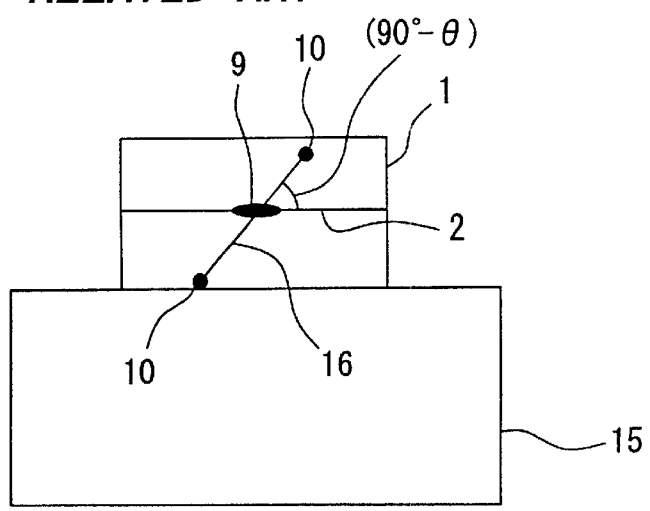
FIG. 5 is a schematic view showing an end surface of a related-art semiconductor laser device having a problem solved by the present invention.

However, if no special measures are taken on the laser chip and the laser chip has an ordinary lateral dimension of about 200–300 $\mu$m, sub-beams 10 returned from the optical disk 6 will be incident on the end surface of the laser chip 1 as shown in FIG. 5. This problem will be explained below before describing the embodiment further.

In the case where the angle $\theta$ is formed between the optical axis of the light emitted from the semiconductor laser chip 1 to the inclined mirror 4 and the tangential direction 8 of the information-recording track of the optical disk 6, the returned sub-beams 10 enter the end surface of the semiconductor laser chip 1 at points that are 70–80 $\mu$m apart from the emission point 9 in opposite directions of (90–$\theta$)° with respect to the PN junction 2.

The distance between two returned sub-beams 10 in a direction perpendicular to the PN junction 2 of the semiconductor laser chip, namely, the difference in level between the incidence points of the two returned sub-beams 10, is smaller than an ordinary thickness (about 100 $\mu$m) of semiconductor laser chips. Thus, in using the method of preventing the returned sub-beams 10 from being incident on the end surface of the semiconductor laser chip by making the semiconductor laser chip thinner or disposing the PN junction at the center of the semiconductor laser chip, it is necessary to make the semiconductor laser chip considerably thin. In this case, the semiconductor laser chip may crack or a stress may be applied to the emission point. Consequently, the characteristic of the semiconductor laser chip will deteriorate. Thus it is impossible to use such a solution. The semiconductor laser chip 1 according to the present invention solves this problem.

Figure 6A:
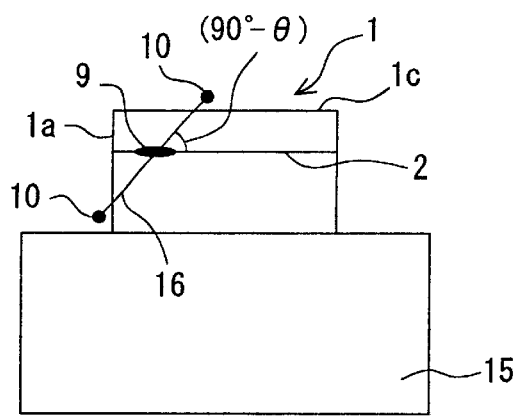
FIGS. 6A and 6B are schematic views each showing an end surface of a semiconductor laser chip included in a semiconductor laser device according to a first embodiment of the present invention.
Figure 6B:
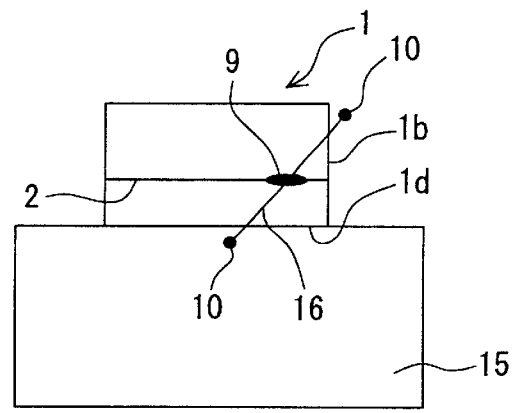

FIGS. 6A and 6B are schematic views showing end surfaces of semiconductor laser devices each including an exemplary semiconductor laser chip 1 according to the embodiment of the present invention.

In the example shown in FIG. 6A, the emission point 9 on the PN junction 2 is within 80 $\mu$m of one lateral side surface 1a of the semiconductor laser chip 1 and also of an upper surface 1c thereof. More accurately, the emission point 9 is within 80*cos(90°–$\theta$) $\mu$m of the lateral side surface 1a and within 80*sin(90°–$\theta$)) $\mu$m of the upper surface 1c. Due to the position of the emission point 9, the returned sub-beams 10 are not incident on the end surface of the semiconductor laser chip 1. The angle (90°–$\theta$) is an angle formed between the PN junction 2 and an imaginary line 16 connecting the points of incidence of the returned beams on a plane including the end surface of the semiconductor laser chip 1. In this embodiment, the end surface of the semiconductor laser chip 1 has a shape of a parallelogram with right angles, namely a rectangle.

The example of the semiconductor laser chip 1 shown in FIG. 6B is equivalent to the example of the semiconductor laser chip 1 shown in FIG. 6A as rotated 180 degrees around its center. In the FIG. 6B example, a lateral side surface 1b and a lower surface 1d of the laser chip 1 satisfy the above-described conditions.

Figure 7A:
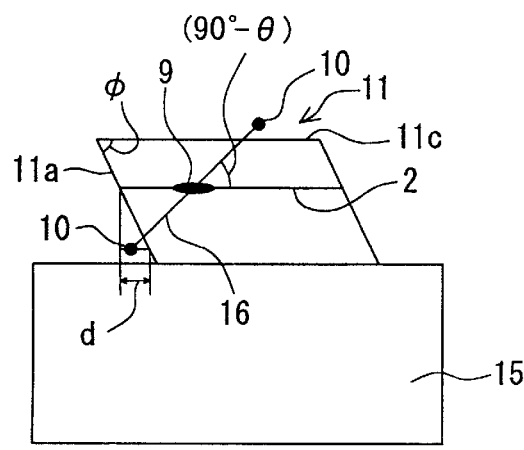
FIGS. 7A and 7B are schematic views each showing an end surface of a semiconductor laser chip included in a semiconductor laser device according to a second embodiment of the present invention.
Figure 7B:
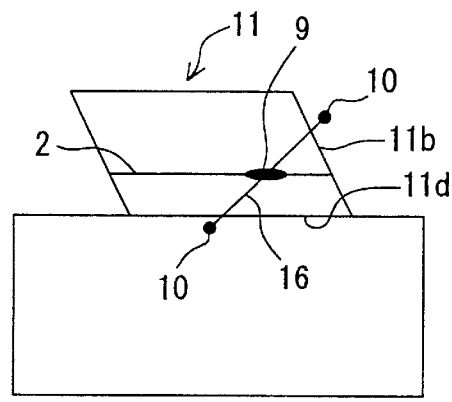

FIGS. 7A and 7B show examples of a semiconductor laser chip 11 formed by growing a crystal on an off-oriented substrate according to a second embodiment of the present invention. In this embodiment, a light emission end surface of each example of the semiconductor laser chip 11 forms a parallelogram not right-angled in its vertexes.

In the example shown in FIG. 7A, the laser chip 11 is formed such that the emission point 9 on the PN junction 2 is located within a distance of d+80*cos(90°−θ) μm of a lateral side surface 11a of the laser chip and within a distance of 80*sin (90°−θ) μm of an upper surface 11c thereof. Supposing that the smaller vertex angle of the parallelogram of the light emission end surface is Φ, $$d=80*\sin(90°-\theta)/\tan \Phi \ (\mu m).$$

That is, the emission point 9 can be further spaced from the side surface 11a by a distance d, as compared with the first embodiment.

Because semiconductor laser chips have many non-emission recombination centers, such as crystalline defects caused by mechanical flaws, stresses, and external forces, in the neighborhood of their side surfaces, an emission point located farther from the side surfaces of the semiconductor laser chip would less affect the reliability of the device.

The example of the semiconductor laser chip 11 shown in FIG. 7B is equivalent to the example of the semiconductor laser chip 11 shown in FIG. 7A as rotated 180 degrees around its center. In the FIG. 7B example, a side surface 11b and a lower surface 11d of the laser chip 11 satisfy the above-described conditions.

Figure 8A:
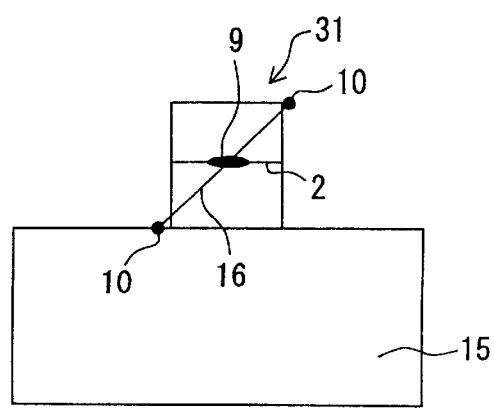
FIGS. 8A and 8B are schematic views each showing an end surface of a semiconductor laser chip included in a semiconductor laser device according to a third embodiment of the present invention.
Figure 8B:
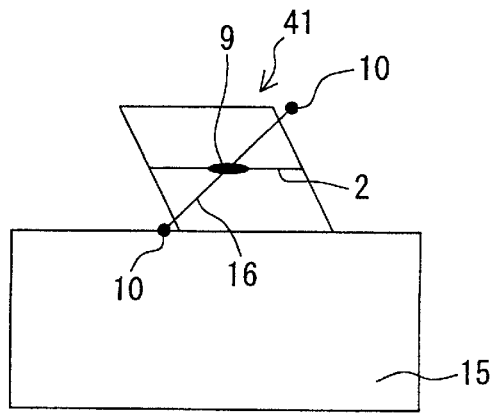

FIGS. 8A and 8B shows examples of a semiconductor laser chip that has a width of 160 μm or less.

A semiconductor laser chip 31 shown in FIG. 8A has a rectangular end surface and its emission point 9 is located approximately at the center of the end surface.

A semiconductor laser chip 41 shown in FIG. 8B has been formed by growing a crystal on an off-oriented substrate and has an emission end surface of a shape of parallelogram with oblique angles. The emission point 9 is located approximately at the center of the emission end surface.

By using any of the semiconductor laser chips 1, 11, 31, and 41 of the first to third embodiments, returned sub-beams 10 are prevented from entering the semiconductor laser chip even though the optical pickup 13 is arranged such that the optical axis of light emitted from the semiconductor laser chip is inclined with respect to the tangent 8 of the information-recording track of the optical disk loaded 6, as shown in FIG. 4. Therefore, it is possible to make compact the entire optical disk device having the optical pickup. At this time, in the embodiments, the diffraction grating 3 for generating sub-beams is inclined about 30° with respect to the information-recording surface of the optical disk. The semiconductor laser device of the present invention and the optical pickup using it are particularly effective for CD (laser wavelength: infrared ray) optical disk systems and DVD-RAM (laser wavelength: infrared ray) optical disk systems in which a tracking servo is performed by detecting a track signal by a three-beam method, a differential push-pull method, or any other appropriate method using sub-beams.

As is obvious, owing to the construction described above, in manufacturing a compact end product, the present invention is capable of preventing the performance of the semiconductor laser device from deteriorating due to reflection of returned sub-beams from the end surface of the semiconductor laser chip, without executing additional processing to the laser chip. Therefore, the present invention achieves the simplification of the manufacturing process and the improvement of quality.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser chip comprising:

a PN junction, an emission point on the PN junction, and wherein said emission point is located at a non-central location of a light emission end surface of the semiconductor laser chip and at a distance of 80 μm or less along the PN junction from a first lateral side surface of the semiconductor laser chip, so that the emission point is closer to the first lateral side surface of the chip than to a second lateral side surface of the chip opposite the first lateral side surface at the end surface, wherein the end surface of the laser chip is in the shape of a parallelogram, but where the first and second lateral side surfaces are both slanted with regard to vertical so that they do not form right angles with a surface on which the chip is mounted.

2. The semiconductor laser chip according to claim 1, wherein the light emission end surface is in a shape of a parallelogram.

3. The semiconductor laser chip according to claim 1, having a width of 160 μm or less, said width being defined between the opposite first and second lateral side surfaces of the semiconductor laser chip.

4. The semiconductor laser chip according to claim 1, wherein a distance between the PN junction and at least one of upper and lower surfaces of said semiconductor laser chip is 80 μm or less.

5. An optical pickup having the semiconductor laser chip according to claim 1 for reading information from a information-recording medium by irradiating the information-recording medium with light emitted from the semiconductor laser chip, wherein when light is emitted from the semiconductor laser chip, there take place a plurality of returned beams from the information-recording medium to a plane including the end surface of the semiconductor laser chip, and an imaginary line connecting points of incidence of the returned beams on said plane forms an angle of less than 90° with the PN junction of the semiconductor laser chip.

6. The optical pickup according to claim 5, wherein said plurality of returned beams comprise a returned main beam and one or more returned sub-beams, and said one or more returned sub-beams are not incident on said end surface of the semiconductor laser chip.

7. A semiconductor laser device for use as a light source of an optical pickup detecting a track signal by a method using sub-beams, said semiconductor laser device comprising a semiconductor laser chip having an emission point that is entirely located at a non-central part of an end surface of the chip and at a distance of 80 μm or less from a lateral side surface of the semiconductor laser chip; and wherein the end surface of the laser chip is in the shape of a parallelogram, but where first and second opposite lateral side surfaces are both slanted with regard to vertical so that they do not form right angles with a surface on which the chip is mounted.

* * * * *